(12) United States Patent
Kinoshita et al.

(10) Patent No.: US 9,455,326 B2
(45) Date of Patent: Sep. 27, 2016

(54) WIDE BANDGAP SEMICONDUCTOR DEVICE

(75) Inventors: Akimasa Kinoshita, Tsukuba (JP); Noriyuki Iwamuro, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/365,152

(22) PCT Filed: Feb. 15, 2012

(86) PCT No.: PCT/JP2012/053506
§ 371 (c)(1),
(2), (4) Date: Jul. 10, 2014

(87) PCT Pub. No.: WO2013/121532
PCT Pub. Date: Aug. 22, 2013

(65) Prior Publication Data
US 2014/0327019 A1    Nov. 6, 2014

(51) Int. Cl.
*H01L 29/15* (2006.01)
*H01L 29/47* (2006.01)
(Continued)

(52) U.S. Cl.
CPC .............. *H01L 29/47* (2013.01); *H01L 24/05* (2013.01); *H01L 29/1608* (2013.01); *H01L 29/41* (2013.01); *H01L 29/475* (2013.01); *H01L 29/872* (2013.01); *H01L 24/48* (2013.01); *H01L 29/2003* (2013.01); *H01L 2224/02166* (2013.01); *H01L 2224/04042* (2013.01); *H01L 2224/05186* (2013.01); *H01L 2224/05552* (2013.01);
(Continued)

(58) Field of Classification Search
USPC ............... 257/77, 76, 471, 473, 478, 484, 257/E33.051, E31.065, E31.066, E27.06, 8, 257/E29.148
See application file for complete search history.

(56) References Cited

U.S. PATENT DOCUMENTS

2007/0228505 A1* 10/2007 Mazzola ............... H01L 29/872
257/471
2008/0296587 A1    12/2008 Yamamoto et al.
2009/0008651 A1    1/2009 Okuno et al.

FOREIGN PATENT DOCUMENTS

JP    2000252478 A    9/2000
JP    2002-314098 A    10/2002
(Continued)

OTHER PUBLICATIONS

Krishna Shenai et al., "Optimum Semiconductors for High-Power Electronics", IEEE Transaction on Electron Devices, Sep. 1989, pp. 1811-1823, vol. 36, No. 9.
(Continued)

*Primary Examiner* — Timor Karimy
(74) *Attorney, Agent, or Firm* — Rabin & Berdo, P.C.

(57) ABSTRACT

A wide bandgap semiconductor device includes a first conductive type high-concentration wide bandgap semiconductor substrate, a first conductive type low-concentration wide bandgap semiconductor deposited film which is formed on the semiconductor substrate, a metal film which is formed on the semiconductor deposited film so that a Schottoky interface region is formed between the metal film and the semiconductor deposited film, and a second conductive type region which is formed in a region of the semiconductor deposited film corresponding to a peripheral portion of the metal film, wherein the Schottoky interface region in the semiconductor deposited film is surrounded by the second conductive type region so that periodic island regions are formed in the Schottoky interface region.

9 Claims, 8 Drawing Sheets

(51) Int. Cl.
    *H01L 29/872* (2006.01)
    *H01L 29/41* (2006.01)
    *H01L 29/16* (2006.01)
    *H01L 23/00* (2006.01)
    *H01L 29/20* (2006.01)

(52) U.S. Cl.
    CPC ............... *H01L2224/05567* (2013.01); *H01L 2224/05624* (2013.01); *H01L 2224/48463* (2013.01); *H01L 2924/00013* (2013.01); *H01L 2924/00014* (2013.01); *H01L 2924/12032* (2013.01); *H01L 2924/1305* (2013.01); *H01L 2924/13055* (2013.01); *H01L 2924/13091* (2013.01)

(56) References Cited

FOREIGN PATENT DOCUMENTS

| | | |
|---|---|---|
| JP | 2002314098 A | 10/2002 |
| JP | 2006352006 A | 12/2006 |
| JP | 2008-300506 A | 12/2008 |
| JP | 2009-016603 A | 1/2009 |
| JP | 2009-094433 A | 4/2009 |
| JP | 2009-130002 A | 6/2009 |
| JP | 2009158519 A | 7/2009 |
| JP | 2010040857 A | 2/2010 |
| JP | 2010-087483 A | 4/2010 |

OTHER PUBLICATIONS

Takeo Yamamoto et al., "1200-V JBS Diodes with Low Threshold Voltage and Low Leakage Current", Materials Science Forum, 2009, pp. 939-942, vols. 600-603.

Commissioner of the Patent Office; "Reasons for Submission"; JP 2012-094683 A; Jan. 16, 2015.

Japanese Office Action with translation dated Mar. 17, 2015.

Japanese Notification mailed Sep. 8, 2015 with its partial translation.

* cited by examiner

WIDE BANDGAP SEMICONDUCTOR DEVICE

TECHNICAL FIELD

The present invention relates to a wide bandgap semiconductor device which has an interface between a wide bandgap semiconductor and a metal formed on the wide bandgap semiconductor so that apart of the interface between the wide bandgap semiconductor and the metal film is a Schottoky interface.

BACKGROUND ART

In the background art, silicon single crystal has been used as a material for power semiconductor elements which control a high breakdown voltage and a large current. There are several types of power semiconductor elements. In the current circumstances, these types of power semiconductor elements are used properly in accordance with purposes. For example, a bipolar transistor or an IGBT (Insulated Gate Bipolar Transistor) can secure a large current density but cannot perform switching at high speed. The bipolar transistor has an application limit at several kHz while the IGBT has an application limit at about several tens of kHz.

On the other hand, a power MOSFET cannot secure a large current but can be used at high speedup to several MHz. However, due to a strong demand of the market for power devices that can secure a large current and high speed performance, efforts have been made to improve the IGBT and the power MOSFET so that development has been currently advanced up to the level substantially close to the material limit. In addition, material research has been made in view of a power semiconductor element. As a next-generation power semiconductor element, silicon carbide (hereinafter abbreviated to SiC) has gathered attention because it is an element excellent in low on-state voltage and high speed and high temperature characteristics (see NPL 1, identified further on).

SiC is a chemically very stable material. Due to the bandgap as wide as 3 eV, SiC can be used as a semiconductor extremely stably even at a high temperature. In addition, SiC is also larger in the breakdown strength by at least one digit than silicon. This also applies to gallium nitride (hereinafter abbreviated to GaN) which is another wide bandgap semiconductor material.

A Schottoky barrier diode having a rectification characteristic can be manufactured by depositing a metal on the surface of a wide bandgap semiconductor, similarly to silicon. From these reasons, it is possible to manufacture a Schottoky barrier diode with a high breakdown voltage and low on-resistance by using a wide bandgap semiconductor as a substrate material.

When a reverse voltage is applied to a diode having an ideal rectification characteristic, no current flows. When a forward voltage is applied to the diode, the diode has no resistance. However, when a reverse voltage is applied to a typically manufactured diode, a very small amount of current (leakage current) flows. When a forward voltage is applied to the diode, the diode has a little resistance (on-resistance). When a device having a Schottoky interface such as a Schottoky barrier diode has a high Schottoky barrier height, the device can restrain a leakage current to increase a breakdown voltage but on-resistance becomes large. On the contrary, when the Schottoky barrier height is low, the on-resistance becomes small but the leakage current becomes large.

As described above, there is a trade-off relation between the leakage current in the reverse electric characteristic and the on-resistance in the forward electric characteristic. From these reasons, a metal can be selected in accordance with a use purpose for manufacturing a Schottoky barrier diode. However, since the Schottoky barrier height of the manufactured Schottoky barrier diode is characterized by electron affinity of the semiconductor and the work function of the metal, an optimum Schottoky barrier diode for the use purpose cannot be always manufactured.

As described above, if the Schottoky barrier height is low, leakage increases even in a wide bandgap semiconductor Schottoky barrier diode. A diode using a junction barrier Schottoky structure (hereinafter abbreviated to JBS structure) is used as a method for solving this problem. In the JBS structure, a first conductive type semiconductor region under a Schottoky electrode is sandwiched between second conductive type semiconductor regions to deplete the first conductive type semiconductor in a Schottoky interface portion to thereby restrain a leakage current. In addition, as the thickness of a depletion layer (the width of a depletion layer extending from the Schottoky interface toward a semiconductor substrate) is larger, the leakage current is restrained more greatly.

As a general JBS structure, either a structure in which a first conductive type semiconductor forming a Schottoky interface and a second conductive type semiconductor are disposed alternately like stripes (see NPL 2, identified further on) or a structure in which a first conductive type semiconductor and a second conductive type semiconductor are disposed alternately and concentrically (see PTL 1, identified further on) has been used. However, since a depletion layer is thin in a Schottoky interface portion between a metal and the first conductive type semiconductor located away from the second conductive type semiconductor, an effect of reducing a leakage current is weakened. Moreover, when the distance between the second conductive type semiconductor regions which sandwich the first conductive type semiconductor is reduced for the purpose of widening the depletion layer in order to restrain the leakage current, on-resistance is increased.

CITATION LIST

Patent Literature

PTL 1: JP-2008-300506

Non-Patent Literature

NPL 1: IEEE Transaction on Electron Devices (Vol. 36, p. 1811, 1989)
NPL 2: Mater, Sci. Forum, 600-603 (2009) 939

TECHNICAL PROBLEM

An object of the invention is to restrain increase of a leakage current at the time of application of a reserve voltage to a device having a metal-wide bandgap semiconductor interface in a wide bandgap semiconductor device, or increase of on-resistance.

SUMMARY

The object is attained by the following wide bandgap semiconductor device.

(1) A wide bandgap semiconductor device, including: a first conductive type high-concentration wide bandgap semiconductor substrate; a first conductive type low-concentration wide bandgap semiconductor deposited film which is formed on the first conductive type high-concentration wide bandgap semiconductor substrate; a metal film which is formed on the first conductive type low-concentration wide bandgap semiconductor deposited film so that a Schottoky interface region is formed between the metal film and the first conductive type low-concentration wide bandgap semiconductor deposited film; and a second conductive type region which is formed in a region of the first conductive type low-concentration wide bandgap semiconductor deposited film corresponding to a peripheral portion of the metal film; characterized in that: the Schottoky interface region in the first conductive type low-concentration wide bandgap semiconductor deposited film is surrounded by the second conductive type region so that periodic island regions are formed in the Schottoky interface region.

(2) A wide bandgap semiconductor device according to the paragraph (1), characterized in that: the relation S2×N2≥S1×N1 is established when S1 designates a contact area between the metal film and the island regions, N1 designates an impurity concentration of the first conductive type low-concentration wide bandgap semiconductor deposited film, S2 designates a total contact area between the metal film and the second conductive type region and N2 designates an impurity concentration of the second conductive type region.

(3) A wide bandgap semiconductor device according to the paragraph (1) or (2), characterized in that: the shape of each of the island regions is a regular polygon.

(4) A wide bandgap semiconductor device according to the paragraph (1) or (2), characterized in that: the shape of each of the island regions is a circle.

(5) A wide bandgap semiconductor device according to any one of the paragraphs (1) through (4), characterized in that: the wide bandgap semiconductor is SiC.

(6) A wide bandgap semiconductor device according to any one of the paragraphs (1) through (4), characterized in that: the wide bandgap semiconductor is gallium nitride.

Advantageous Effects of Invention

According to the invention, a diode having a JBS structure is designed as a device having a Schottoky interface formed on a wide bandgap semiconductor. In the JBS structure, a structure in which a region with an interface between a metal deposited film and a first conductive type semiconductor as the Schottoky interface is surrounded by a second conductive type region is disposed periodically. Thus, the device can be manufactured to avoid the increase of on-resistance increased due to the second conductive type region while restraining a leakage current. Further, the effect of reducing the on-resistance can be enhanced when the Schottoky interface is formed with a low Schottoky barrier height or the impurity concentration of the first conductive type semiconductor is increased.

DETAILED DESCRIPTION

The invention provides a wide bandgap semiconductor device, including: a first conductive type high-concentration wide bandgap semiconductor substrate; a first conductive type low-concentration wide bandgap semiconductor deposited film which is formed on the first conductive type high-concentration wide bandgap semiconductor substrate; a metal film which is formed on the first conductive type low-concentration wide bandgap semiconductor deposited film so that a Schottoky interface region is formed between the metal film and the first conductive type low-concentration wide bandgap semiconductor deposited film; and a second conductive type region which is formed in a region of the first conductive type low-concentration wide bandgap semiconductor deposited film corresponding to a peripheral portion of the metal film; characterized in that: the Schottoky interface region in the first conductive type low-concentration wide bandgap semiconductor deposited film is surrounded by the second conductive type region so that periodic island regions are formed in the Schottoky interface region.

In the JBS structure, a leakage current decreases as a voltage at the time of depletion of the first conductive type region decreases. In the JBS structure in which the second conductive type region is disposed like stripes, the extent of a depletion layer depends on an impurity concentration of the first conductive type semiconductor and an impurity concentration of the second conductive type semiconductor, as shown in a one-dimensional model.

However, when the second conductive type region is formed not like stripes but a shape surrounding the first conductive type region, the first conductive type region can be depleted from all directions. Therefore, the voltage required for depletion of the first conductive type region having the same area is decreased, so that it is possible to expect an effect of restraining a leakage current and an effect for increasing the first conductive type impurity concentration to reduce on-resistance.

Moreover, in order to deplete the first conductive type region in the Schottoky interface, the total amount of carriers in the second conductive type semiconductor region must be larger than the total amount of carriers in the first conductive type semiconductor serving as an area where the Schottoky interface is formed. Therefore, the design is made to establish the relation S2×N2≥S1×N1 when S1 designates a contact area between the metal film and the island regions, N1 designates an impurity concentration of the first conductive type low-concentration wide bandgap semiconductor deposited film, S2 designates a contact area between the metal film and the second conductive type region and N2 designates an impurity concentration of the second conductive type region.

(First Embodiment)

Figure 1:
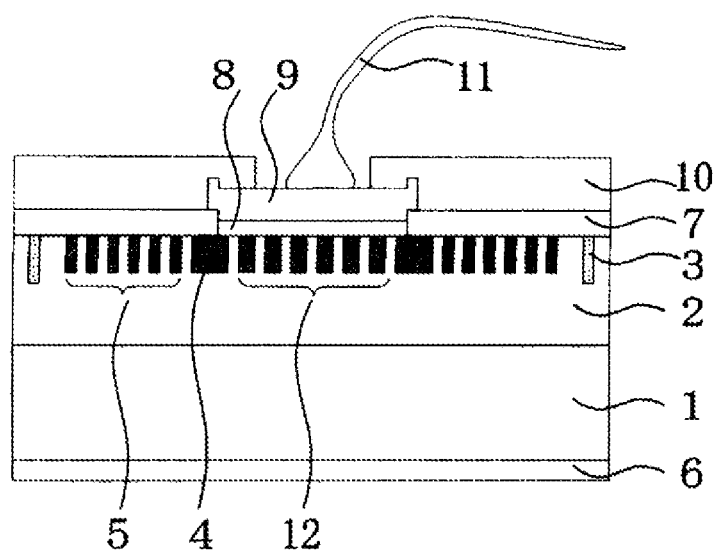
FIG. 1 shows a sectional view for explaining an SiC-JBS structure diode.

FIG. 1 shows a sectional view of an SiC-JBS diode as a first embodiment according to the invention. The Schottky barrier diode has: an n-type SiC deposited film 2 which is 6 µm thick and doped with $1.8 \times 10^{16}$ cm$^{-3}$ nitrogen and which is formed on the surface of a high-concentration n-type SiC substrate 1 with a (0001) plane 300 µm thick and doped with $1 \times 10^{18}$ cm$^{-3}$ nitrogen; a channel stopper 3 which is doped with high concentration of phosphorus; a p-type impurity region 4 which is doped with high concentration of aluminum; six p-type impurity regions 5 which are doped with aluminum in order to disperse an electric field and which are arranged around the p-type impurity region 4 serving as an electric field relaxation region and at intervals of 1.5 µm from the p-type impurity region 4; an ohmic electrode 6 which is formed on the back side; an interlayer insulation film 7 which is 0.5 µm thick and made of silicon oxide; an electrode pad 9 which is made of aluminum; and a bonding wire 11 for connection with an external device. Here, a Schottoky electrode 8 is, for example, made of titanium silicide and titanium carbide. A p-type impurity region 12 is formed under the Schottky electrode 8. The Schottky electrode 8 overlaps with the p-type impurity region 4 by 4 µm.

Figure 2:
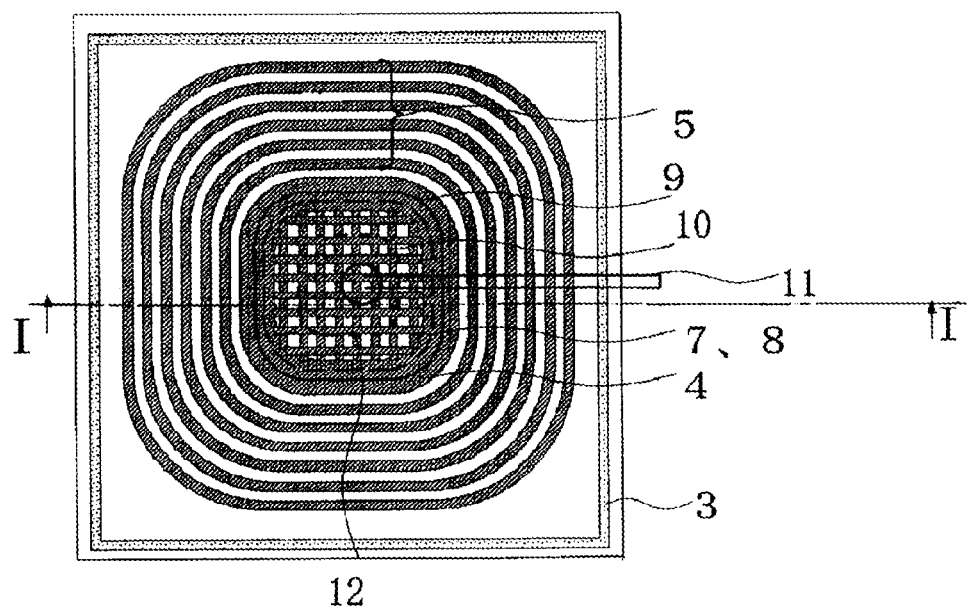
FIG. 2 shows a view of a mask layout of an SiC Schottoky barrier diode shown as a first embodiment.

FIG. 2 is an example of a layout view of the SiC Schottky barrier diode shown as the first embodiment of the invention. A section taken along the line I-I' in FIG. 2 corresponds to FIG. 1. The channel stopper 3 is disposed to surround the whole structure. The Schottoky electrode 8 is shaped like a square having a curvature of 150 µm in corners so as not to cause concentration of an electric field in the corners. The periphery of the Schottky electrode 8 is disposed at an equal interval relative to the p-type impurity region 4 for a termination structure so as to overlap with the p-type impurity region 4 by 4 µm. The p-type impurity region 4 for the termination structure and each of the p-type impurity regions 5 for an FLR structure have shapes with corner curvatures changed so as to achieve an equal interval between the p-type impurity region 4 and the p-type impurity region 5. A passivation film 10 is formed to expose a part of the electrode pad 9 for connection with an external device. Here, in order to make connection with an external device, the bonding wire 11 is connected to the exposed electrode pad 9.

The p-type impurity region 12 is formed under the Schottoky electrode 8 so that island regions of n-type layer regions doped with nitrogen are disposed periodically to have a square shape with a longest part of 3 µm and the island regions are surrounded by 2 µm-wide p-type regions doped with aluminum. Thus, it is possible to provide a JBS diode in which a leakage current and on-resistance can be restrained.

Incidentally, although the structure of the Schottky barrier diode made of SiC on the SiC (0001) plane substrate has been described in this embodiment, it is also possible to apply the invention to a (000-1) plane substrate. Moreover, it is also possible to apply the invention to a wide bandgap semiconductor such as GaN. In addition, although description has been made in the case where titanium is used as an example of a metal forming a Schottky interface of the Schottky barrier diode manufactured on the SiC substrate, the metal is not limited to titanium but any material can be used likewise as long as the material can form the Schottky interface. Although each island region is shaped like a tetragon, it is a matter of course that any shape such as a circle, a triangle or a hexagon can be used to obtain the effect of the invention as long as the shape can be disposed periodically. In addition, although the impurity region 4 formed in p-type and the impurity regions 5 formed in p-type are formed to have a floating limiting ring (FLR) structure as an example of the electric field relaxation structure, it is a matter of course that the effect of the invention can be obtained even when the impurity region 4 and the impurity regions 5 have another electric field relaxation structure such as a junction termination extension (JTE) structure or a floating plate structure. In addition, although the structure in which the p-type electric field relaxation regions are formed in the n-type SiC substrate has been described as a structure example, it is a matter of course that the effect of the invention can be obtained even by use of a structure using different conductive types such as a structure in which n-type electric field relaxation regions are formed in a p-type SiC substrate.

FIGS. 3A-3F are sectional views showing a process of manufacturing the JBS structure diode shown in the first embodiment of the invention.

Figure 3A:
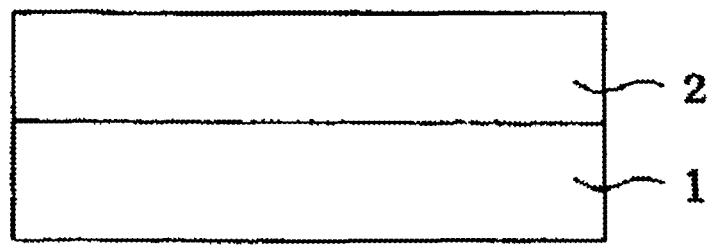
FIGS. 3A-3F show sectional views for explaining a process of manufacturing the SiC-JBS structure diode.

In FIG. 3A, a low-concentration n-type deposited film 2 having a thickness of 6 µm and doped with $1.8 \times 10^{16}$ cm$^{-3}$ nitrogen is deposited on the surface of a high-concentration n-type substrate 1 with a (0001) plane having a thickness of 300 µm and doped with $1 \times 10^{18}$ cm$^{-3}$ nitrogen.

Figure 3B:
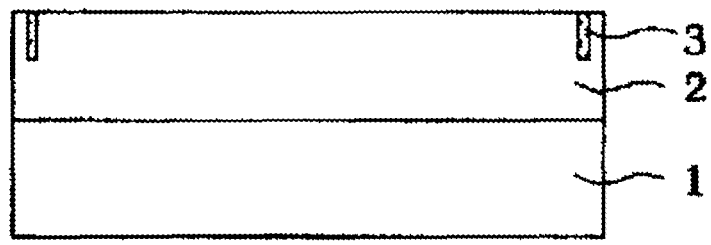
Figure 3C:
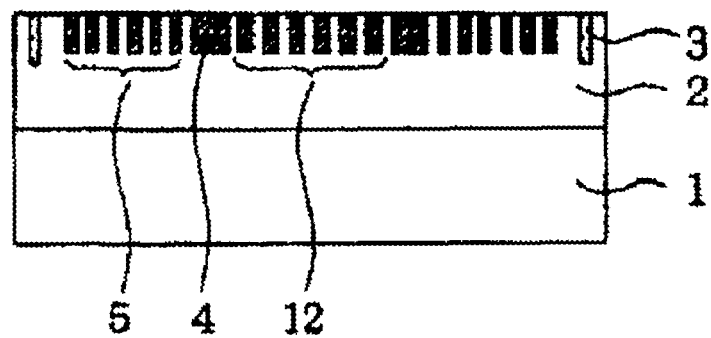

In FIG. 3B, phosphorus is implanted into the SiC substrate for forming a channel stopper 3. In FIG. 3C, aluminum is implanted for forming a p-type impurity region 4 for a termination structure, p-type impurity regions 5 for an FLR structure and a p-type impurity region 12. In order to activate phosphorus which has been implanted for forming the n-type impurity region for the channel stopper 3, and aluminum which has been implanted for forming the p-type impurity region 4 for the termination structure, the p-type impurity regions 5 for the FLR structure and the p-type impurity region 12, activation is performed for 240 seconds at 1650° C. in an Ar atmosphere.

Figure 3D:
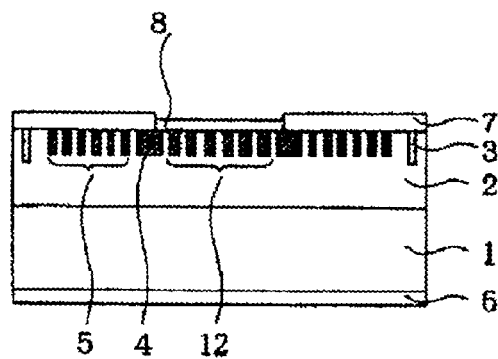
Figure 3E:
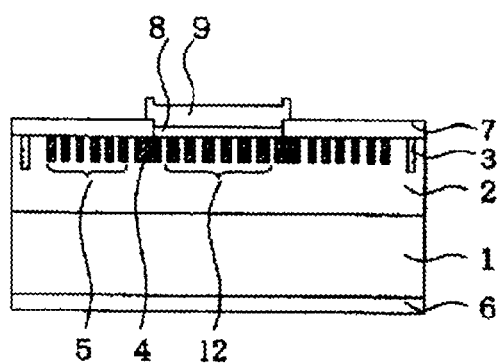
Figure 3F:
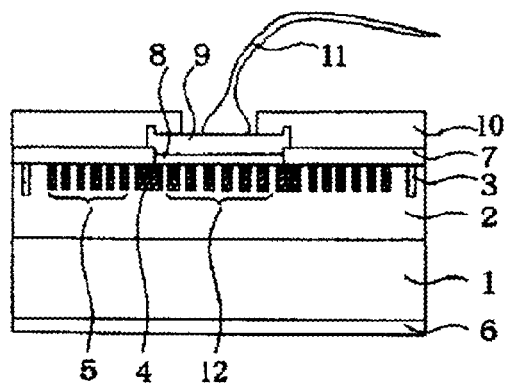

In FIG. 3D, an ohmic electrode 6 is formed on the back side of the SiC substrate. An interlayer insulation film 7 is formed on the SiC substrate. For example, titanium is vapor-deposited in a vacuum in a portion where a Schottky electrode should be formed, and processing is performed thereon, for example, for 5 minutes at 500° C. in an argon atmosphere, for example, in order to form a Schottky electrode made of titanium silicide and titanium carbide. A termination portion of the Schottky electrode 8 is formed so that an end of the Schottky electrode 8 overlaps with the p-type impurity region 4 in order to operate the Schottky barrier diode as a high-voltage device. In FIG. 3E, an electrode pad 9 made of aluminum is formed as a pad for connecting the Schottky electrode with an external device. In FIG. 3F, a polyimide film is deposited as a passivation film 10 for preventing discharge from occurring in the surface due to high voltage. A bonding wire 11 for connection with an external device is connected to the electrode pad 9.

Figure 4:
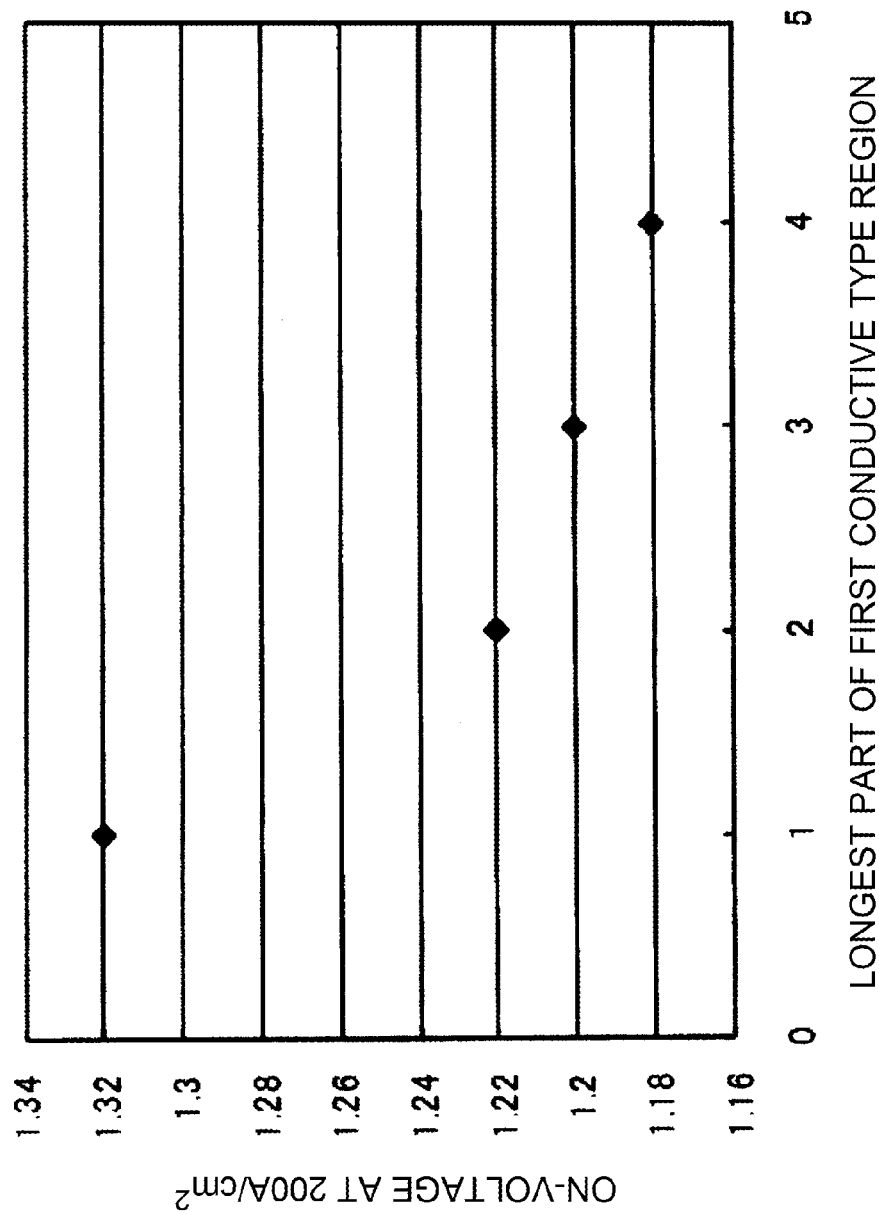
FIG. 4 shows a graph showing the relation between the width of a first conductive type semiconductor and on-resistance in the SiC-JBS structure diode.

FIG. 4 shows the relation between the width of each of the n-type layer regions doped with nitrogen in the p-type impurity region 12 under the Schottoky electrode 8 and on-voltage at a current of 200 A/cm$^2$, as to the SiC-JBS diode having the periodic structure shown in the first embodiment. It can be said that when the width of each of the n-type impurity regions doped with nitrogen in the p-type impurity region 12 under the Schottky electrode 8 is made not shorter than 1 µm, the increase of the on-voltage (on-resistance) can be restrained.

Figure 5:
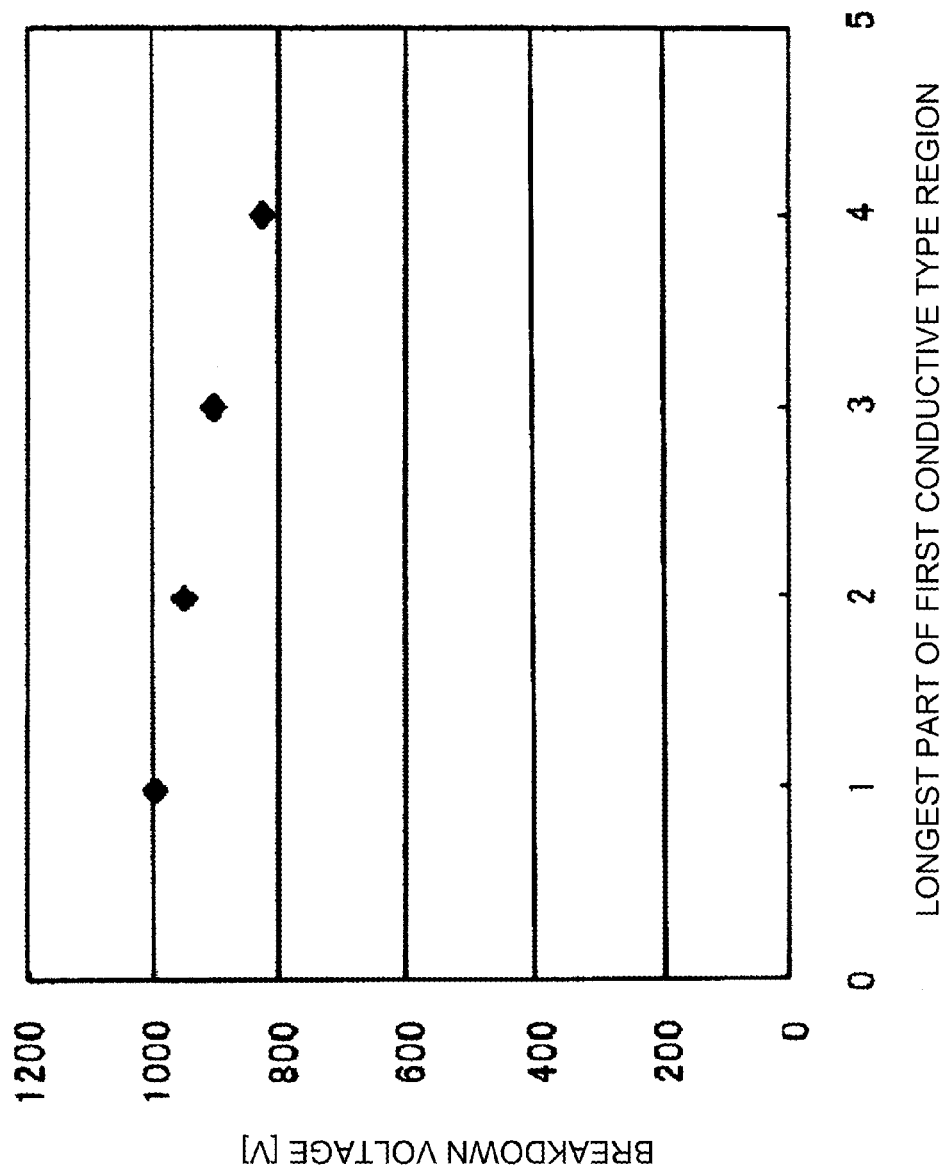
FIG. 5 shows a graph showing the relation between the width of the first conductive type semiconductor and a breakdown voltage in the SiC-JBS structure diode.

FIG. 5 shows the relation between the width of each of the n-type layer regions of the island regions in the p-type impurity region 12 under the Schottoky electrode 8 and the breakdown voltage during application of a reverse voltage, as to the SiC-JBS diode having the periodic structure shown in the first embodiment. It can be said that when the width of each of the island regions of the n-type layer regions in the p-type impurity region 12 under the Schottoky electrode 8 is made not longer than 4 μm, the decrease of the breakdown voltage can be suppressed to be 20% or less.

(Second Embodiment)

Figure 6:
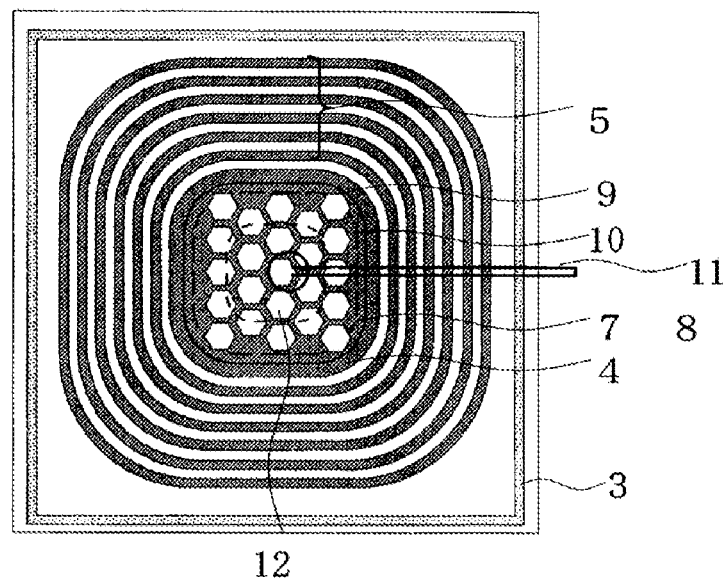
FIG. 6 shows a view of a mask layout of an SiC Schottoky barrier diode shown as a second embodiment.

A second embodiment of the invention will be described. FIG. 6 is an example of a layout view of an SiC Schottoky barrier diode shown as the second embodiment. This embodiment is different from the first embodiment in that the shape of each island region is changed. The remaining configuration is the same as that in the first embodiment.

In FIG. 6, island regions of n-type layer regions are disposed periodically in a p-type impurity region 12 under the Schottoky electrode 8 so that the island regions are arranged to be shaped like a regular hexagon having a longest part of 3 μm and surrounded by 2 μm-wide p-type regions doped with aluminum.

According to this structure, when any region having a Schottoky interface is depleted, the depletion starts from six sides. Therefore, a depletion layer under the Schottoky interface can be made thick with a lower voltage and a leakage current can be restrained. In addition, if it is a regular polygon having the equal longest part, the area will be larger as the number of sides is larger. Therefore, on-resistance can be also reduced.

(Third Embodiment)

Figure 7:
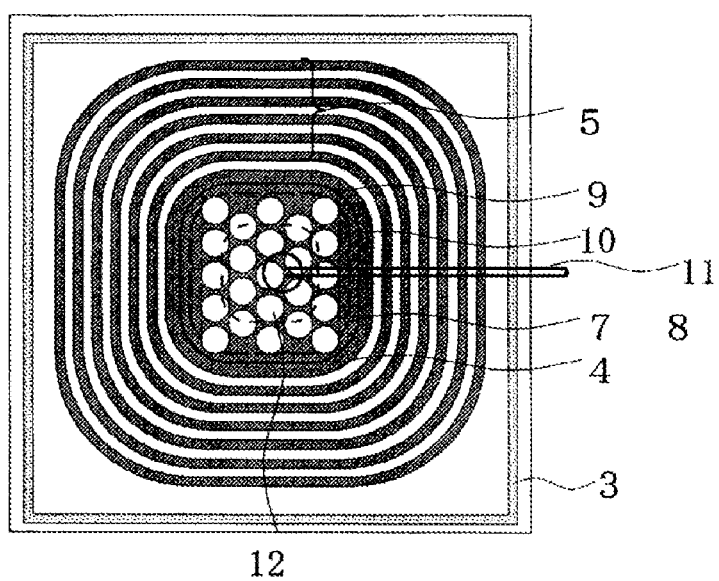
FIG. 7 shows a view of a mask layout of an SiC Schottoky barrier diode shown as a third embodiment.

A third embodiment of the invention will be described. FIG. 7 is an example of a mask layout view of an SiC Schottoky barrier diode shown as the third embodiment. This embodiment is different from the first embodiment in that the shape of each island region is changed. The remaining configuration is the same as that in the first and second embodiments.

In FIG. 7, island regions of n-type layer regions are disposed periodically in a p-type impurity region 12 under the Schottoky electrode 8 so that the island regions are arranged to be shaped like a circle having a diameter of 3 μm and surrounded by 2 μm-wide p-type regions doped with aluminum.

According to this structure, when any region having a Schottoky interface is depleted, the depletion starts equally from the circumference of the circle. Therefore, a depletion layer under the Schottoky interface can be made thick with a low voltage with highest efficiency and a leakage current can be restrained. In addition, since the circle is an extreme shape of a polygon having the equal longest part, on-resistance can be reduced efficiently.

Although the embodiments of the invention have been described above in detail, the invention is not limited to the aforementioned embodiments. Various changes of design can be made without departing from the spirit or scope of the invention.

Although each of the embodiments of the invention has been described in accordance with a sectional view in a JBS structure diode having a termination structure, it is a matter of course that any device having a Schottoky interface formed on a wide bandgap semiconductor can be applied to a device using Schottoky junction, such as a diode having a structure within a scope not departing from the spirit or scope of the invention, for example, a diode having a DMT structure or a TMBS structure using a Schottoky barrier.

REFERENCE SIGNS LIST 1 high-concentration n-type SiC substrate
2 low-concentration n-type SiC deposited film
3 channel stopper
4 p-type impurity region (termination)
5 p-type impurity region (FLR)
6 ohmic electrode
7 interlayer insulation film
8 Schottoky electrode
9 electrode pad
10 passivation film
11 bonding wire
12 p-type impurity region (JBS)

The invention claimed is:

1. A wide bandgap semiconductor device, comprising:
a first conductive type high-concentration wide bandgap semiconductor substrate;
a first conductive type low-concentration wide bandgap semiconductor deposited film which is formed on the first conductive type high-concentration wide bandgap semiconductor substrate;
a metal film which is formed on the first conductive type low-concentration wide bandgap semiconductor deposited film so that a Schottoky interface region is formed between the metal film and the first conductive type low-concentration wide bandgap semiconductor deposited film; and
a second conductive type region which is formed in a region of the first conductive type low-concentration wide bandgap semiconductor deposited film corresponding to a peripheral portion of the metal film;
wherein:
the Schottoky interface region in the first conductive type low-concentration wide bandgap semiconductor deposited film is surrounded by the second conductive type region so that periodic island regions are formed in the Schottoky interface region;
the relation $S2 \times N2 \geq S1 \times N1$ is established when S1 designates a contact area between the metal film and the island regions, N1 designates an impurity concentration of the first conductive type low-concentration wide bandgap semiconductor deposited film, S2 designates a contact area between the metal film and the second conductive type region and N2 designates an impurity concentration of the second conductive type region;
a width of each of the island regions is not shorter than 1 μm and not longer than 4 μm; and
the second conductive type region is a one region having a uniform depth, has a wider width from an outer perimeter to an outermost perimeter of the island regions than a width of an interval between two island regions, and is surrounded by a floating limiting ring (FLR) structure, a junction termination extension (JTE) structure or a floating plate structure having the second conductive type.

2. The wide bandgap semiconductor device according to claim 1, wherein: a shape of each of the island regions is a regular polygon.

3. The wide bandgap semiconductor device according to claim 2, wherein: the wide bandgap semiconductor device includes SiC.

4. The wide bandgap semiconductor device according to claim 2, wherein: the wide bandgap semiconductor device includes gallium nitride.

5. The wide bandgap semiconductor device according to claim 1, wherein: a shape of each of the island regions is a circle.

6. The wide bandgap semiconductor device according to claim 5, wherein: the wide bandgap semiconductor device includes SiC.

7. The wide bandgap semiconductor device according to claim 1, wherein: the wide bandgap semiconductor device includes SiC.

8. The wide bandgap semiconductor device according to claim 5, wherein: the wide bandgap semiconductor device includes gallium nitride.

9. The wide bandgap semiconductor device according to claim 1, wherein: the wide bandgap semiconductor device includes gallium nitride.

* * * * *